US012388429B2

(12) United States Patent
Granger-Jones et al.

(10) Patent No.: US 12,388,429 B2
(45) Date of Patent: Aug. 12, 2025

(54) GROUP DELAY DETERMINATION IN A COMMUNICATION CIRCUIT

(71) Applicant: Qorvo US, Inc., Greensboro, NC (US)

(72) Inventors: Marcus Granger-Jones, Scotts Valley, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 503 days.

(21) Appl. No.: 17/960,389

(22) Filed: Oct. 5, 2022

(65) Prior Publication Data

US 2023/0121439 A1    Apr. 20, 2023

Related U.S. Application Data

(60) Provisional application No. 63/255,662, filed on Oct. 14, 2021.

(51) Int. Cl.
*H03K 5/06* (2006.01)
*H03K 5/24* (2006.01)
(Continued)

(52) U.S. Cl.
CPC .................. *H03K 5/06* (2013.01); *H03K 5/24* (2013.01); *H04B 1/40* (2013.01); *H03K 2005/00013* (2013.01)

(58) Field of Classification Search
CPC .................. H03K 5/1534; H03K 5/133; H03K 19/017509; H03K 2005/00078;
(Continued)

(56) References Cited

U.S. PATENT DOCUMENTS 10,197,605 B2 *  2/2019  Quiquempoix ....... G01R 23/165
2005/0036400 A1 *  2/2005  Chen ..................... G11C 7/1039
                                                           365/233.1
(Continued)

FOREIGN PATENT DOCUMENTS

EP          3070839 A1     9/2016
KR       101397548 B1     5/2014

OTHER PUBLICATIONS

Hussain, S., "Fast and Efficient Encoder with concurrent Bubble error correction for Flash ADC," International Journal of Modern Trends in Engineeringand Research, Jul. 2-4, 2015, Ijmter-2015, 9 pages.
(Continued)

Primary Examiner — Ajibola A Akinyemi
(74) Attorney, Agent, or Firm — Withrow & Terranova, P.L.L.C.

(57) ABSTRACT

Group delay determination in a communication circuit is disclosed. The communication circuit includes a power amplifier circuit that amplifies a radio frequency (RF) signal based on a modulated voltage and a power management integrated circuit (PMIC) that generates the modulated voltage. Herein, the PMIC includes a group delay determination circuit to determine a relative group delay between the modulated voltage and a modulated current, which is internal to the power amplifier circuit and unknown to the PMIC, solely based on signals known to the PMIC. The determined relative group delay can help to time align the modulated voltage with the modulated current at the power amplifier circuit to improve error vector magnitude (EVM) and/or adjacent channel leakage ratio (ACLR). Further, by determining the relative group delay based on known signals to the PMIC, it is possible to achieve good time alignment between the modulated voltage and the modulated current.

20 Claims, 9 Drawing Sheets

(51) Int. Cl.
*H04B 1/40* (2015.01)
*H03K 5/00* (2006.01)

(58) Field of Classification Search
CPC .............. H03K 5/13; H03K 19/018507; H03K
19/0963; H03K 19/215; H03K 23/005;
H03K 23/40; H03K 17/102; H03K
17/687; H03K 19/20; H03K 2005/00293;
H03K 3/0315; H03K 5/003; H03K 5/134;
H03K 17/08122; H03K 17/0822; H03K
17/284; H03K 19/0185; H03K 19/17788;
H03K 2005/00013; H03K 5/1565; H03K
5/159; H03K 17/04123; H03K 17/145;
H03K 17/6872; H03K 19/00361; H03K
19/018585; H03K 3/356191; H03K 5/01;
H03K 5/06; H03K 5/14
USPC .......................................................... 455/73
See application file for complete search history.

(56) References Cited

U.S. PATENT DOCUMENTS

| 2008/0242246 | A1 | 10/2008 | Minnis et al. |
| 2016/0365836 | A1 | 12/2016 | Khlat et al. |
| 2020/0259685 | A1 | 8/2020 | Khlat |
| 2023/0132888 | A1 | 5/2023 | Granger-Jones et al. |

OTHER PUBLICATIONS

Monticelli, D.M, "A quad CMOS single-supply op amp with rail-to-rail output swing," IEEE Journal of Solid-State Circuits, vol. 21, Issue 6, Dec. 1986, 9 pages.

Pardhu, T. et al., "A low power flash ADC with Wallace tree encoder," 2014 Eleventh International Conference on Wireless and Optical Communications Networks (WOCN), Sep. 11-13, 2014, Vijayawada, India, IEEE, 4 pages.

Extended European Search Report for European Patent Application No. 22201414.4, mailed Feb. 27, 2023, 10 pages.

Extended European Search Report for European Patent Application No. 22205428.0, mailed Mar. 16, 2023, 11 pages.

* cited by examiner

GROUP DELAY DETERMINATION IN A COMMUNICATION CIRCUIT

RELATED APPLICATIONS

This application claims the benefit of U.S. provisional patent application Ser. No. 63/255,662, filed on Oct. 14, 2021, the disclosure of which is hereby incorporated herein by reference in its entirety.

FIELD OF THE DISCLOSURE

The technology of the disclosure relates generally to determining a group delay in a communication circuit, such as a wireless transmission circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third generation (3G) and fourth generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) and average power tracking (APT) are power management techniques designed to improve operating efficiency of the power amplifier(s). Specifically, the power amplifier(s) is configured to amplify the RF signal(s) based on a modulated voltage (ET voltage or APT voltage) that closely tracks a time-variant power envelope of the RF signal(s). The time-variant voltage is typically generated by a power management integrated circuit (PMIC) in the wireless communication device. Notably, the modulated voltage and the RF signal(s) may have experienced different group delays when arriving at the power amplifier(s). Herein, a group delay refers generally to a sum of time delay experienced by a signal propagating through one or more active/passive circuits of different processing capabilities and/or operating frequencies. As a result, the modulated voltage may become misaligned with the time-variant power envelope of the RF signal(s) at the power amplifier(s) to therefore cause a degraded error vector magnitude (EVM) and/or adjacent channel leakage ratio (ACLR) in the RF signal(s). In this regard, it is desirable to ensure that the PMIC can maintain good alignment between the modulated voltage and the time-variant power envelope of the RF signal(s).

SUMMARY

Aspects disclosed in the detailed description include group delay determination in a communication circuit. The communication circuit includes a power amplifier circuit that amplifies a radio frequency (RF) signal based on a modulated voltage and a power management integrated circuit (PMIC) that generates the modulated voltage. Herein, the PMIC includes a group delay determination circuit that is configured to determine a relative group delay between the modulated voltage and a modulated current, which is internal to the power amplifier circuit and unknown to the PMIC, solely based on signals (e.g., voltage, current, etc.) that are known to the PMIC. In an embodiment, the determined relative group delay can be used to time align the modulated voltage with the modulated current at the power amplifier circuit to thereby improve error vector magnitude (EVM) and/or adjacent channel leakage ratio (ACLR) of the RF signal. Further, by determining the relative group delay based on known signals to the PMIC, it is possible to achieve good time alignment between the modulated voltage and the modulated current.

In one aspect, a group delay determination circuit is provided. The group delay determination circuit includes a signal conversion circuit. The signal conversion circuit is configured to receive an analog voltage signal related to a modulated voltage and an analog current signal related to a modulated current. The signal conversion circuit is also configured to generate a rectangular voltage signal including multiple voltage rising edges and multiple voltage falling edges based on the received analog voltage signal. The signal conversion circuit is also configured to generate a rectangular current signal including multiple current rising edges and multiple current falling edges based on the received analog current signal and the received analog voltage signal. The group delay determination circuit also includes a control circuit. The control circuit is configured to determine a relative group delay between the modulated voltage and the modulated current based on a relative delay between the rectangular voltage signal and the rectangular current signal.

In another aspect, a communication circuit is provided. The communication circuit includes a power amplifier circuit. The power amplifier circuit is configured to amplify an RF signal associated with a time-variant input power based on a modulated voltage and induces a modulated current that tracks the time-variant input power of the RF signal. The communication circuit also includes a power amplifier integrated circuit (PMIC). The PMIC includes a voltage modulation circuit. The voltage modulation circuit is configured to generate the modulated voltage based on a modulated target voltage. The PMIC also includes a group delay determination circuit. The group delay determination circuit includes a signal conversion circuit. The signal conversion circuit is configured to receive an analog voltage signal related to the modulated voltage and an analog current signal related to the modulated current. The signal conversion circuit is also configured to generate a rectangular voltage signal including multiple voltage rising edges and multiple voltage falling edges based on the received analog voltage signal. The signal conversion circuit is also configured to generate a rectangular current signal including multiple current rising edges and multiple current falling edges based on the received analog current signal and the received analog voltage signal. The group delay determination circuit also includes a control circuit. The control circuit is configured to determine a relative group delay between the modulated voltage and the modulated current based on a relative delay between the rectangular voltage signal and the rectangular current signal.

In another aspect, a method for determining a group delay in a communication circuit is provided. The method includes receiving an analog voltage signal related to a modulated voltage and an analog current signal related to a modulated current. The method also includes generating a rectangular voltage signal including multiple voltage rising edges and multiple voltage falling edges based on the received analog voltage signal. The method also includes generating a rectangular current signal including multiple current rising edges and multiple current falling edges based on the received analog current signal and the received analog voltage signal. The method also includes determining a relative group delay between the modulated voltage and the modulated current based on a relative delay between the rectangular voltage signal and the rectangular current signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
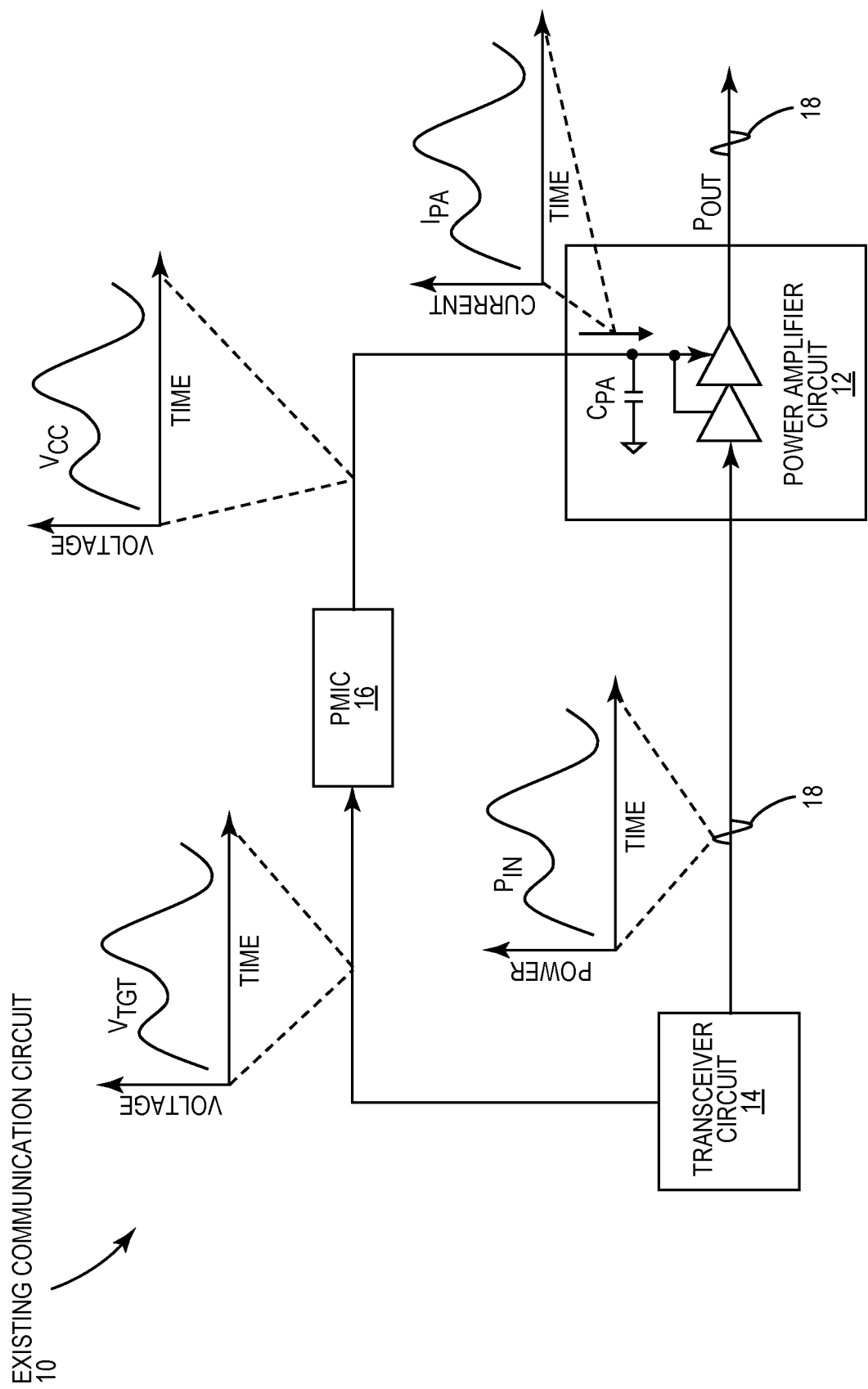
FIG. 1A is a schematic diagram of an exemplary existing communication circuit wherein a modulated voltage and a modulated current can become time misaligned at a power amplifier circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include group delay determination in a communication circuit. The communication circuit includes a power amplifier circuit that amplifies a radio frequency (RF) signal based on a modulated voltage and a power management integrated circuit (PMIC) that generates the modulated voltage. Herein, the PMIC includes a group delay determination circuit that is configured to determine a relative group delay between the modulated voltage and a modulated current, which is internal to the power amplifier circuit and unknown to the PMIC, solely based on signals (e.g., voltage, current, etc.) that are known to the PMIC. In an embodiment, the determined relative group delay can be used to time align the modulated voltage with the modulated current at the power amplifier circuit to thereby improve error vector magnitude (EVM) and/or adjacent channel leakage ratio (ACLR) of the RF signal. Further, by determining the relative group delay based on known signals to the PMIC, it is possible to achieve good time alignment between the modulated voltage and the modulated current.

Figure 1C:
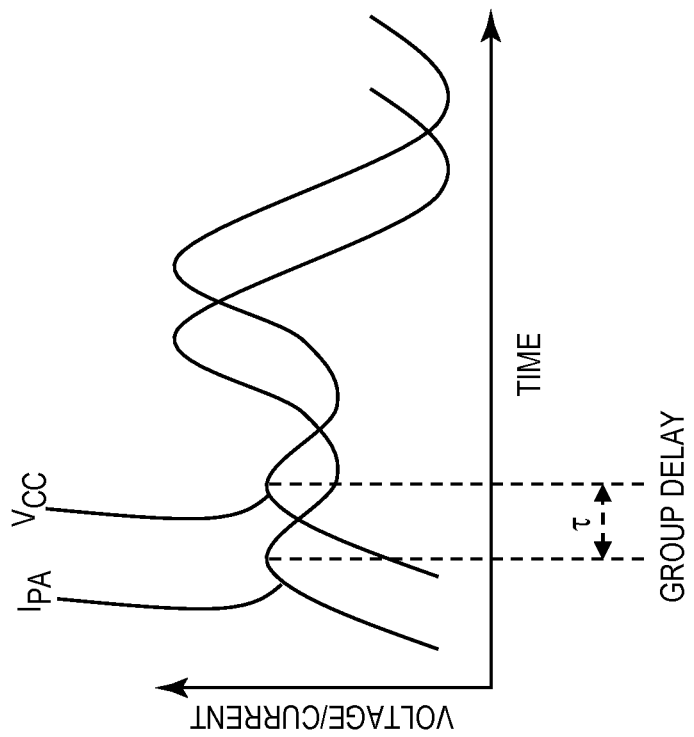
FIG. 1C is a graphic diagram providing an exemplary illustration of the modulated voltage lagging behind the modulated current.
Figure 1B:
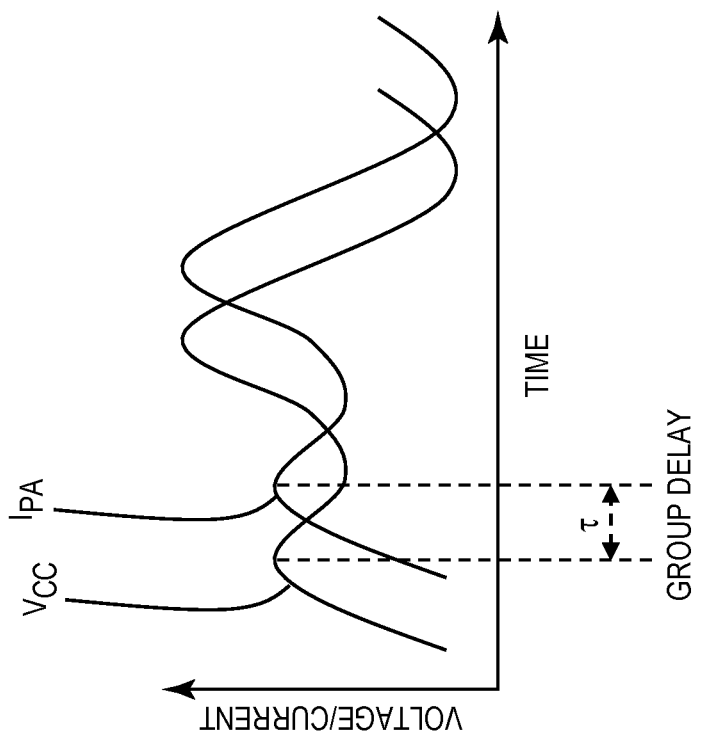
FIG. 1B is a graphic diagram providing an exemplary illustration of the modulated voltage leading the modulated current.
Figure 2:
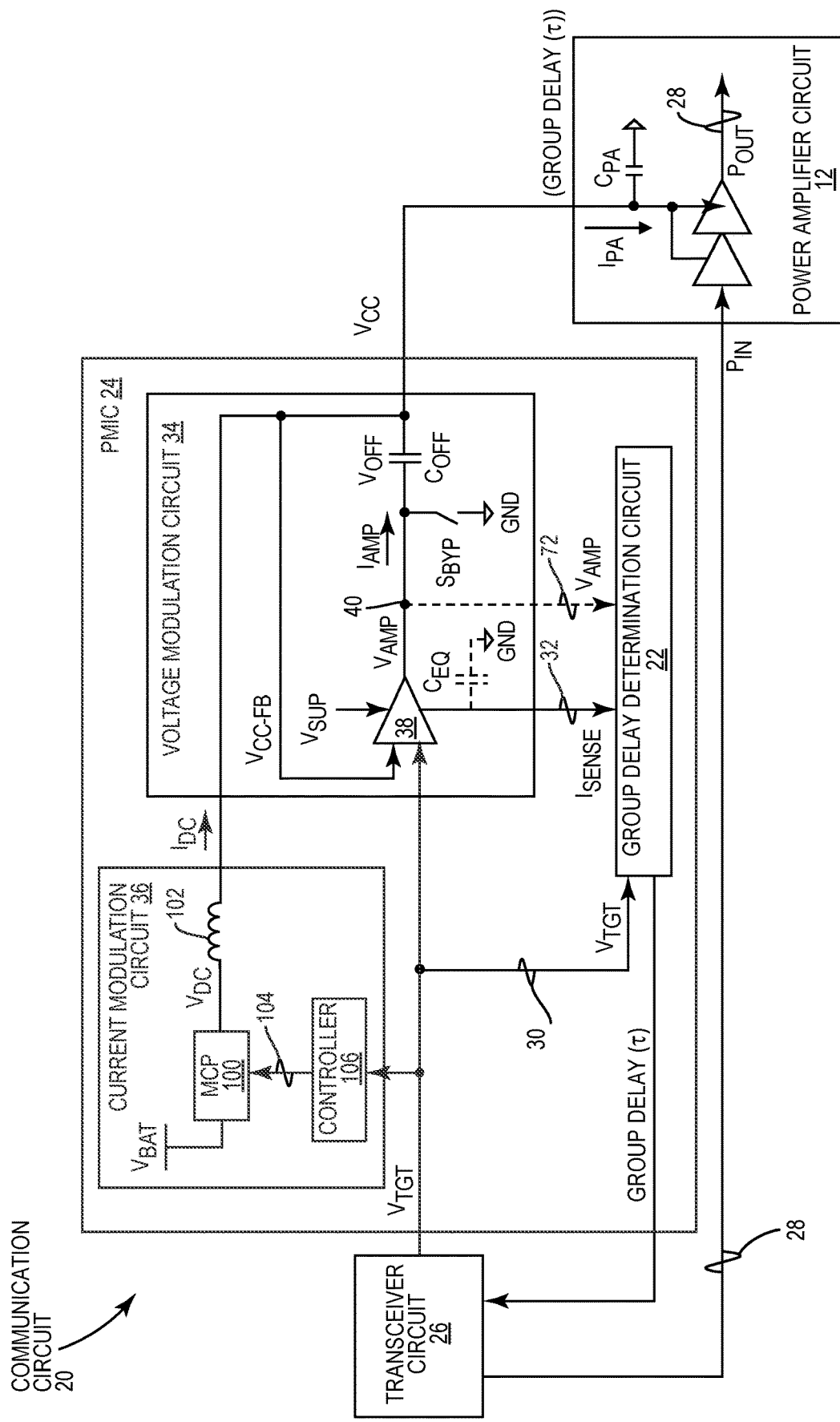
FIG. 2 is a schematic diagram of an exemplary communication circuit wherein a group delay determination circuit can be configured according to embodiments of the present disclosure to determine a relative group delay between a modulated voltage and a modulated current, which is unknown to the group delay determination circuit, solely based on signals known to the group delay determination circuit.

Before discussing group delay determination of the present disclosure, starting at FIG. 2, a brief overview of an existing communication circuit that may experience a group delay between a modulated voltage and a modulated current is first provided with reference to FIGS. 1A-1C.

FIG. 1A is a schematic diagram of an exemplary existing communication circuit 10 wherein a modulated voltage $V_{CC}$ and a modulated current $I_{PA}$ can become time misaligned at a power amplifier circuit 12. The existing communication circuit 10 also includes a transceiver circuit 14 and a PMIC 16.

The transceiver circuit 14 is configured to generate an RF signal 18 having a time-variant input power $P_{IN}$ and provide the RF signal 18 to the power amplifier circuit 12. The transceiver circuit 14 also generates a modulated target voltage $V_{TGT}$ that tracks the time-variant input power $P_{IN}$ and provides the modulated target voltage $V_{TGT}$ to the PMIC 16. The PMIC 16 is configured to generate a modulated voltage $V_{CC}$ that tracks the modulated target voltage $V_{TGT}$ and provides the modulated voltage $V_{CC}$ to the power amplifier circuit 12. Herein, the modulated target voltage $V_{TGT}$ and the modulated voltage $V_{CC}$ are time-variant voltages that are so generated (a.k.a. modulated) in accordance with the time-variant input power $P_{IN}$. Understandably, the transceiver circuit 14 may control (a.k.a. adjust) relative timing between the modulated target voltage $V_{TGT}$ and the RF signal 18 by delaying/advancing one or more of the modulated target voltage $V_{TGT}$ and the RF signal 18.

The power amplifier circuit 12 is configured to amplify the RF signal 18 from the time-variant input power $P_{IN}$ to a time-variant output power Pour based on the modulated voltage $V_{CC}$. Notably, the power amplifier circuit 12 often includes a load capacitor $C_{PA}$ to help improve impedance matching between the power amplifier circuit 12 and the PMIC 16. The load capacitor $C_{PA}$, however, can cause a modulated current $I_{PA}$ that closely resembles the time-variant input power $P_{IN}$ of the RF signal 18. Herein, the modulated current $I_{PA}$ is a time-variant current that varies according to the time-variant input power $P_{IN}$ of the RF signal 18.

The modulated voltage $V_{CC}$ and the modulated current $I_{PA}$ are typically monotonically related. However, since the modulated voltage $V_{CC}$ is provided by the PMIC 16 and the modulated current $I_{PA}$ is induced internally in the power amplifier circuit 12, the modulated voltage $V_{CC}$ and the modulated current $I_{PA}$ can experience different group delays at the power amplifier circuit 12. As a result, the modulated voltage $V_{CC}$ and the modulated current $I_{PA}$ can become misaligned at the power amplifier circuit 12.

FIGS. 1B and 1C illustrate two scenarios where the modulated voltage $V_{CC}$ and the modulated current $I_{PA}$ are misaligned at the power amplifier circuit 12. Specifically, FIG. 1B shows that the modulated voltage $V_{CC}$ is ahead of (a.k.a. leading) the modulated current $I_{PA}$ by a relative group delay $\tau$ and FIG. 1C shows that the modulated voltage $V_{CC}$ is behind of (a.k.a. trailing) the modulated current $I_{PA}$ by the relative group delay $\tau$.

With reference back to FIG. 1A, the relative group delay $\tau$ can cause distortion (e.g., amplitude clipping) in the RF signal 18, which can further lead to a degraded EVM and/or ACLR in the RF signal 18. In this regard, it is desirable to eliminate the relative group delay $\tau$ between the modulated voltage $V_{CC}$ and the modulated current $I_{PA}$. Moreover, to be able to eliminate the relative group delay $\tau$, it is necessary to first measure the relative group delay $\tau$ between the modulated voltage $V_{CC}$ and the modulated current $I_{PA}$.

Conventionally, the relative group delay $\tau$ is measured at the power amplifier circuit 12 with a calibration/test equipment of some sort. This proves to be a challenging task given the fact that the existing communication circuit 10 often employs multiple power amplifier circuits made by different vendors. In this regard, it is further desirable to determine the relative group delay $\tau$ without complexity associated with the conventional approach.

FIG. 2 is a schematic diagram of an exemplary communication circuit 20, wherein a group delay determination circuit 22 in a PMIC 24 is configured according to embodiments of the present disclosure to determine a relative group delay $\tau$ between a modulated voltage $V_{CC}$ and a modulated current $I_{PA}$ solely based on signals available in the PMIC 24. By determining the relative group delay $\tau$ inside the PMIC 24 based solely on the signals available in the PMIC 24, it is possible to eliminate the complexity associated with the conventional approach of determining the relative group delay $\tau$ in the existing communication circuit 10 of FIG. 1A. As a result, it is possible to drop the PMIC 24 into the communication circuit 20 to work with any power amplifier circuit of any vendor, such as the power amplifier circuit 12 in FIG. 1A.

In a non-limiting example, the communication circuit 20 includes a transceiver circuit 26 and the power amplifier circuit 12 in FIG. 1A. Notably, the power amplifier circuit 12 is provided herein to simply illustrate the fact that the PMIC 24 can operate with any power amplifier circuit of any vendor, including but not limited to the power amplifier circuit 12 in the existing communication circuit of FIG. 1A.

The transceiver circuit 26 is configured to generate an RF signal 28 associated with a time-variant input power $P_{IN}$ and the power amplifier circuit 12 is configured to amplify the RF signal 28 from the time-variant input power to a time-variant output power Pour based on the modulated voltage $V_{CC}$. As previously explained in FIG. 1A, the power amplifier circuit 12 can induce the modulated current $I_{PA}$ that can be misaligned from the modulated voltage $V_{CC}$ by the relative group delay $\tau$. Moreover, as illustrated in FIGS. 1B and 1C, the modulated voltage $V_{CC}$ can either lead or trail behind the modulated current $I_{PA}$ by the relative group delay $\tau$.

Given that the modulated current $I_{PA}$ is induced inside the power amplifier circuit 12, the PMIC 24 would therefore have no direct knowledge about the modulated current $I_{PA}$. In addition, the PMIC 24 may also have no knowledge about the modulated voltage $V_{CC}$ as received by the power amplifier circuit 12. As such, the group delay determination circuit 22 needs to estimate the relative group delay τ solely based on signals that are available in the PMIC 24.

In an embodiment, the group delay determination circuit 22 is configured to estimate the relative group delay τ based on at least an analog voltage signal 30 that is related to the modulated voltage $V_{CC}$ and an analog current signal 32 that is related to the modulated current $I_{PA}$. The analog voltage signal 30 and the analog current signal 32 are either generated inside the PMIC 24 or provided to the PMIC 24 from outside the PMIC 24. In this regard, the group delay determination circuit 22 is able to determine the relative group delay τ independent of the power amplifier circuit 12.

In an embodiment, the PMIC 24 includes a voltage modulation circuit 34 and a current modulation circuit 36. The voltage modulation circuit 34 includes a voltage amplifier 38, an offset capacitor $C_{OFF}$, and a bypass switch $S_{BYP}$. The voltage amplifier 38 is configured to generate a modulated initial voltage $V_{AMP}$ based on a modulated target voltage $V_{TGT}$, which is generated by the transceiver circuit 26 to track the time-variant input power $P_{IN}$ of the RF signal 28, and a supply voltage $V_{SUP}$.

The offset capacitor $C_{OFF}$ and the bypass switch $S_{BYP}$ are both coupled to an output 40 of the voltage amplifier 38. The offset capacitor $C_{OFF}$ is configured to raise the modulated initial voltage $V_{AMP}$ by an offset voltage $V_{OFF}$ to thereby generate the modulated voltage $V_{CC}$ ($V_{CC}=V_{AMP}+V_{OFF}$). In an embodiment, the offset voltage $V_{OFF}$ can be modulated by charging or discharging the offset capacitor $C_{OFF}$. For a specific example as to how the offset voltage $V_{OFF}$ can be modulated to raise the modulated initial voltage $V_{AMP}$ to the modulated voltage $V_{CC}$, please refer to U.S. patent application Ser. No. 17/946,224, entitled "MULTI-VOLTAGE GENERATION CIRCUIT" (hereinafter "Application224").

Notably, while the offset capacitor $C_{OFF}$ is being charged or discharged toward the offset voltage $V_{OFF}$, which may be slow depending on the size of the offset capacitor $C_{OFF}$, the voltage modulation circuit 34 must maintain the modulated voltage $V_{CC}$ at a desired level. In this regard, the voltage amplifier 38 may source or sink a high-frequency current $I_{AMP}$ (e.g., an alternating current) to allow the load capacitor $C_{PA}$, which is much smaller than the offset capacitor $C_{OFF}$, to be quickly charged or discharged to maintain the modulated voltage $V_{CC}$. In this regard, the high-frequency current $I_{AMP}$ is similar to the modulated current $I_{PA}$ and can thus be utilized to represent the modulated current $I_{PA}$ in the power amplifier circuit 12.

In an embodiment, the voltage amplifier 38 may generate a sensed current $I_{SENSE}$ to proportionally represent the high-frequency current $I_{AMP}$. In a non-limiting example, the sensed current $I_{SENSE}$ is inversely related to the high-frequency current $I_{AMP}$ by a scaling factor k (k>100). As such, the sensed current $I_{SENSE}$ is smaller than the high-frequency current $I_{AMP}$.

On another hand, since the voltage modulation circuit 34 is configured to generate the modulated voltage $V_{CC}$ based on the modulated target voltage $V_{TGT}$, the modulated voltage $V_{CC}$ will be substantially similar to the modulated voltage $V_{TGT}$. Accordingly, the modulated target voltage $V_{TGT}$ can be utilized to represent the modulated voltage $V_{CC}$ as received at the power amplifier circuit 12.

In this regard, according to an embodiment of the present disclosure, the group delay determination circuit 22 is configured to receive the modulated target voltage $V_{TGT}$ as the analog voltage signal 30 and the sensed current $I_{SENSE}$ as the analog current signal 32. Accordingly, as described below in FIG. 3, the group delay determination circuit 22 is able to determine the relative group delay τ between the modulated voltage $V_{CC}$ and the modulated current $I_{PA}$ by determining the relative group delay τ between the modulated target voltage $V_{TGT}$ and the sensed current $I_{SENSE}$.

Figure 3:
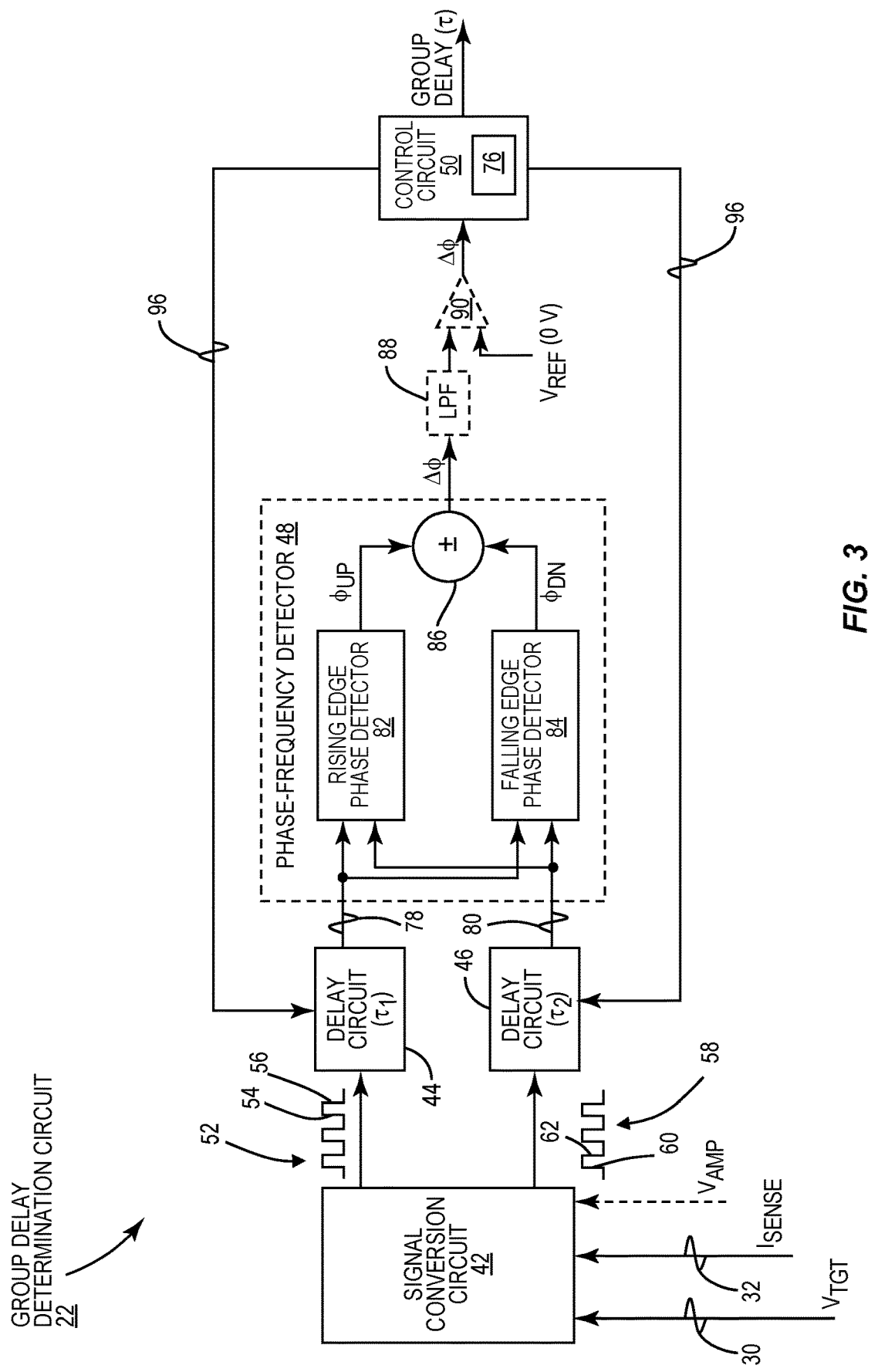
FIG. 3 is a schematic diagram providing an exemplary illustration of the group delay determination circuit in FIG. 2 that is configured according to an embodiment of the present disclosure.

FIG. 3 is a schematic diagram providing an exemplary illustration of the group delay determination circuit 22 in FIG. 2 according to an embodiment of the present disclosure. Common elements between FIGS. 2 and 3 are shown therein with common element numbers and will not be re-described herein.

Herein, the group delay determination circuit 22 includes a signal conversion circuit 42, a first delay circuit 44, a second delay circuit 46, a phase-frequency detector 48, and a control circuit 50. The signal conversion circuit 42 receives the analog voltage signal 30 (e.g., the modulated target voltage $V_{TGT}$) and the analog current signal 32 (e.g., the sensed current $I_{SENSE}$). As is further described in FIG. 4 below, the signal conversion circuit 42 is configured to generate a rectangular current signal 52 (a.k.a. pulse signal), which includes multiple current rising edges 54 and multiple current falling edges 56, based on the analog voltage signal 30. The signal conversion circuit 42 is also configured to generate a rectangular voltage signal 58 (a.k.a. pulse signal), which includes multiple voltage rising edges 60 and multiple voltage falling edges 62, based on the received analog current signal 32 and the received analog voltage signal 30.

Figure 4:
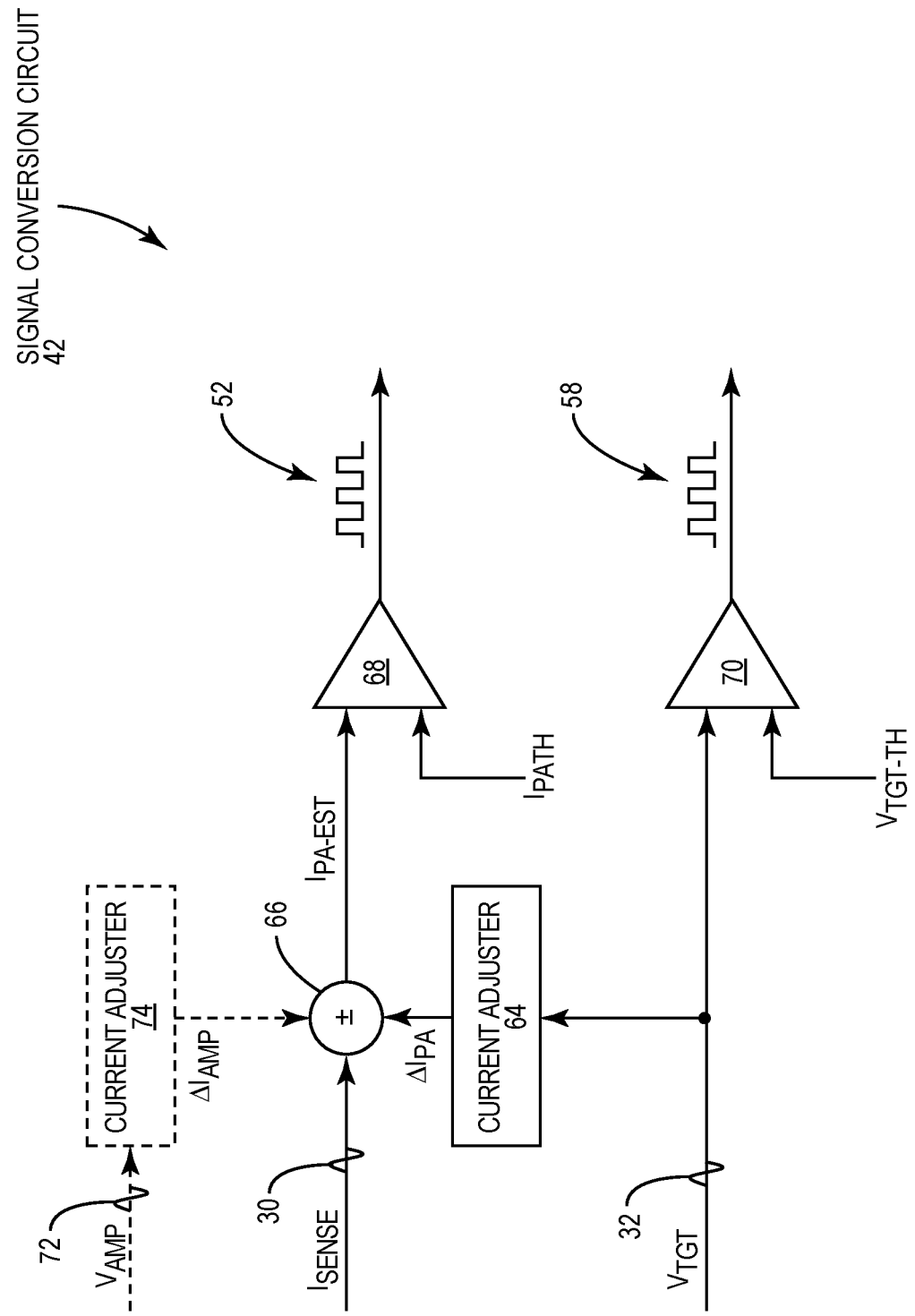
FIG. 4 is a schematic diagram illustrating a signal conversion circuit in the group delay determination circuit of FIG. 3.

FIG. 4 is a schematic diagram illustrating the signal conversion circuit 42 in the group delay determination circuit 22 of FIG. 3 according to an embodiment of the present disclosure. Common elements between FIGS. 3 and 4 are shown therein with common element numbers and will not be re-described herein.

Herein, the signal conversion circuit 42 includes a current adjuster 64, a current combiner 66, a first comparator 68, and a second comparator 70. The current adjuster 64 is configured to estimate a differential $\Delta I_{PA}$ between the modulated current $I_{PA}$ and the analog current signal 32, which is equivalent to the sensed current $I_{SENSE}$, based on the analog voltage signal 30 that is equivalent to the modulated target voltage $V_{TGT}$. In a non-limiting example, the current adjuster 64 can estimate the differential $\Delta I_{PA}$ based on equation (Eq. 1) below.

$$\Delta I_{PA}=C_{PA}/(k*dV_{TGT}/dt) \qquad \text{(Eq. 1)}$$

In the equation (Eq. 1), $C_{PA}$ represents a capacitance of the load capacitor $C_{PA}$ in the power amplifier circuit 12 in FIG. 2 and k (k>1) represents the scaling factor between the sensed current $I_{SENSE}$ and the high-frequency current $I_{AMP}$. Understandably, the differential $\Delta I_{PA}$ can be either positive or negative. The current combiner 66 is configured to combine the analog current signal 32 with the estimated differential $\Delta I_{PA}$ to generate an estimation $I_{PA-EST}$ that can more accurately represent the modulated current $I_{PA}$.

The first comparator 68 is configured to generate the rectangular current signal 52 based on the estimation $I_{PA-EST}$ and a predefined current threshold $I_{PA-TH}$. The second comparator 70 is configured to generate the rectangular voltage signal 58 based on the analog voltage signal 30 and a predefined voltage threshold $V_{TGT-TH}$. In an embodiment, the predefined current threshold $I_{PA-TH}$ and the predefined voltage threshold $V_{TGT-TH}$ may be determined to provide a highest possible sensitivity to accurately detect the current rising edges 54, the current falling edges 56, the voltage rising edges 60, and the voltage falling edges 62.

With reference back to FIG. 2, the voltage amplifier 38 may include such components (e.g., switches) that can cause a parasitic capacitance $C_{EQ}$ that can interact with the modulated initial voltage $V_{AMP}$ to potentially impact the high-frequency current $I_{AMP}$ and, therefore, the sensed current $I_{SENSE}$. In this regard, to ensure that the high-frequency current LAMP, and accordingly the sensed current $I_{SENSE}$, can accurately represent the modulated current $I_{P4}$, it is desirable to further take into consideration the parasitic capacitance $C_{EQ}$ in the determination of the relative group delay τ.

In this regard, the group delay determination circuit 22 may be further configured to receive a second analog voltage signal 72. In an embodiment, the second analog voltage signal 72 is the modulated initial voltage $V_{AMP}$ generated by the voltage amplifier 38.

With reference to FIG. 4, the signal conversion circuit 42 may further include a second current adjuster 74 to estimate an adjustment term $\Delta I_{AMP}$ to the analog current signal 32 based on the second analog voltage signal 72. In a non-limiting example, the second current adjuster 74 can estimate the adjustment term $\Delta I_{AMP}$ based on equation (Eq. 2) below.

$$\Delta I_{AMP} = C_{EQ}/(k*dV_{AMP}/dt) \quad (Eq.\ 2)$$

In the equation (Eq. 2), $C_{EQ}$ represents the parasitic capacitance of the voltage amplifier 38 in the power amplifier circuit 12 in FIG. 2 and k (k>1) represents the scaling factor between the sensed current $I_{SENSE}$ and the high-frequency current $I_{AMP}$. Accordingly, the current combiner 66 is configured to combine the analog current signal 32 with the estimated differential $\Delta I_{P4}$ and the estimated adjustment term $\Delta I_{AMP}$ to generate the estimation $I_{P4-EST}$. Understandably, by further taking into consideration of the parasitic capacitance $C_{EQ}$, the estimation $I_{P4-EST}$ can represent the modulated current $I_{P4}$ with further improved accuracy.

With reference back to FIG. 3, notably when the modulated voltage $V_{CC}$ and the modulated current $I_{P4}$ are misaligned by the relative group delay τ, the rectangular current signal 52 and the rectangular voltage signal 58 will be out of phase as well. As such, it is necessary to first make sure that the modulated target voltage $V_{TGT}$ and the sensed current $I_{SENSE}$ are in phase before determining the relative group delay τ.

In an embodiment, the control circuit 50 is configured to dynamically delay the rectangular current signal 52 and/or the rectangular voltage signal 58 to thereby cause the rectangular current signal 52 to be in-phase with the rectangular voltage signal 58. Once the rectangular current signal 52 and the rectangular voltage signal 58 become in phase, the control circuit 50 can then determine the relative group delay τ between the rectangular current signal 52 and the rectangular voltage signal 58.

In a non-limiting example, the control circuit 50 can include a processor 76 (e.g., a digital signal processor) to dynamically control the first delay circuit 44 to delay the rectangular current signal 52 and/or control the second delay circuit 46 to delay the rectangular voltage signal 58. More specifically, the control circuit 50 can control the first delay circuit 44 to delay the rectangular current signal 52 by a first adjustable delay $\tau_1$ to generate a delayed rectangular current signal 78 and/or control the second delay circuit 46 to delay the rectangular voltage signal 58 by a second adjustable delay 12 to generate a delayed rectangular voltage signal 80.

Understandably, the delayed rectangular current signal 78 is essentially the same as the rectangular current signal 52, except for a difference in a relative phase. As such, the delayed rectangular current signal 78 will also include the current rising edges 54 and the current falling edges 56. Likewise, the delayed rectangular voltage signal 80 is essentially the same as the rectangular voltage signal 58, except for a difference in a relative phase. As such, the delayed rectangular voltage signal 80 will also include the voltage rising edges 60 and the voltage falling edges 62.

The phase-frequency detector 48 is configured to determine a phase differential $\Delta\phi$ between the delayed rectangular current signal 78 and the delayed rectangular voltage signal 80. According to an embodiment of the present disclosure, the control circuit 50 can determine that the delayed rectangular current signal 78 and the delayed rectangular voltage signal 80 are in phase when the phase differential $\Delta\phi$ between the delayed rectangular current signal 78 and the delayed rectangular voltage signal 80 is equal to zero ($\Delta \approx 0$).

In an embodiment, the phase-frequency detector 48 can include a rising edge phase detector 82, a falling edge phase detector 84, and a combiner 86. The rising edge phase detector 82 is configured to detect a rising edge phase offset $\varphi_{UP}$ between each of the current rising edges 54 and a respective one of the voltage rising edges 60. The falling edge phase detector 84 is configured to detect a falling edge phase offset $\phi_{DN}$ between each of the current falling edges 56 and a respective one of the voltage falling edges 62. The combiner 86 is configured to subtract the falling edge phase offset $\phi_{DN}$ from the rising edge phase offset $\phi_{UP}$ to generate the phase differential $\Delta\phi$, as shown in equation (Eq. 3) below.

$$\Delta\phi = \phi_{UP} - \phi_{DN} \quad (Eq.\ 3)$$

Figure 5A:
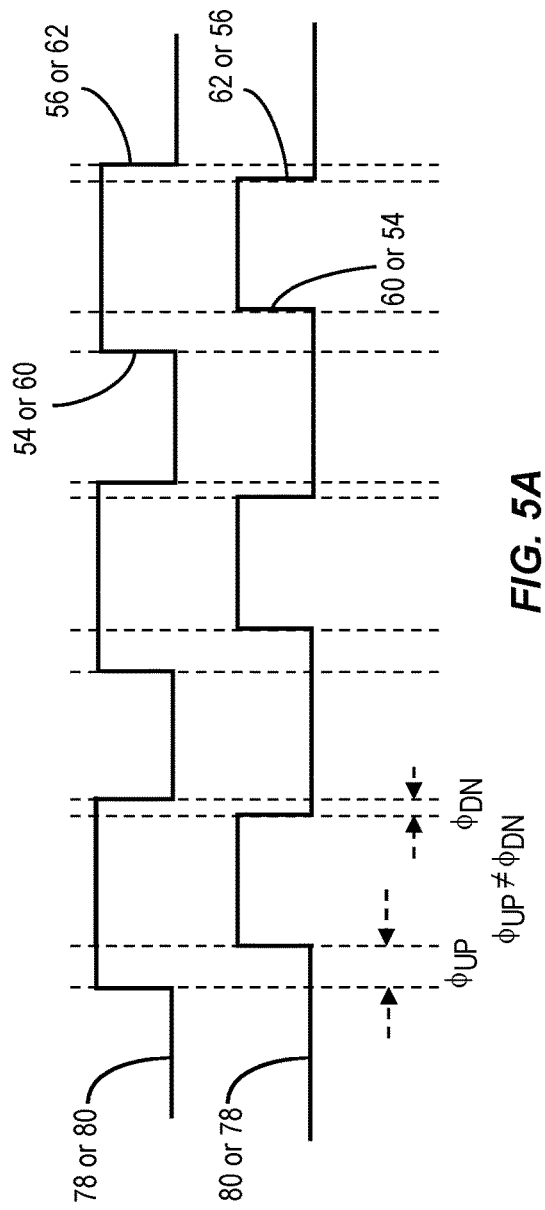
FIGS. 5A and 5B are graphic diagrams illustrating operations of the group delay determination circuit of FIG. 3.
Figure 5B:
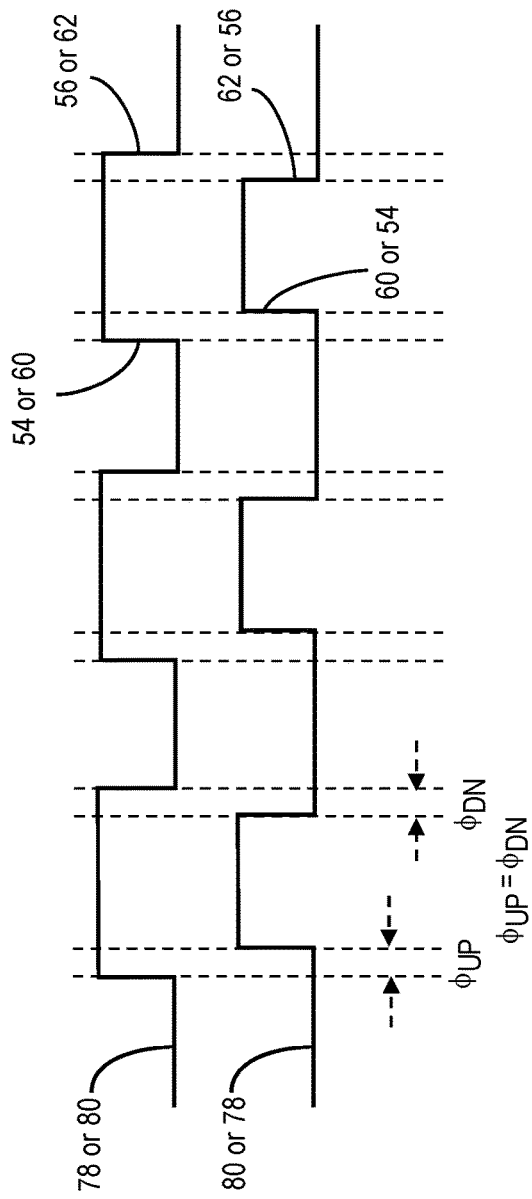

FIGS. 5A and 5B are graphic diagrams providing exemplary illustrations as to how the group delay determination circuit 22 of FIG. 3 can phase align the delayed rectangular current signal 78 and the delayed rectangular voltage signal 80. Common elements between FIGS. 3 and 5A-5B are shown therein with common element numbers and will not be re-described herein.

FIG. 5A provides a visual illustration of the delayed rectangular current signal 78 and the delayed rectangular voltage signal 80 that are out of phase. Regardless of whether the delayed rectangular current signal 78 is ahead of the delayed rectangular voltage signal 80 or behind the delayed rectangular voltage signal 80, the rising edge phase offset $\phi_{UP}$ is different from the falling edge phase offset $\phi_{DN}$. As a result, according to equation (Eq. 3), the phase differential $\Delta\phi$ will not be equal to zero.

FIG. 5B provides a visual illustration of the delayed rectangular current signal 78 and the delayed rectangular voltage signal 80 that are in phase. Herein, regardless of whether the delayed rectangular current signal 78 is ahead of the delayed rectangular voltage signal 80 or behind the delayed rectangular voltage signal 80, the rising edge phase offset $\phi_{UP}$ is equal to the falling edge phase offset $\phi_{DN}$. As a result, according to equation (Eq. 3), the phase differential $\Delta\phi$ will be equal to zero.

With reference back to FIG. 3, the group delay determination circuit 22 may further include a lowpass filter (LPF) 88 and a comparator 90. The comparator 90 may operate based on a reference voltage $V_{REF}$ (e.g., 0 V) to help ensure that the phase differential $\Delta\phi$ is equal to zero when the phase differential $\Delta\phi$ is substantially close to zero (e.g., <0.01).

When the phase differential $\Delta\phi$ is equal to zero, the control circuit 50 may determine the relative group delay τ between the rectangular current signal 52 and the rectangular voltage signal 58 based on equation (Eq. 4) below.

$$\tau = \tau_1 - \tau_2 + \tau_{ADJ} \quad (Eq.\ 4)$$

In the equation (Eq. 4), $\tau_1$ represents the first adjustable delay introduced by the first delay circuit 44, $\tau_2$ represents the second adjustable delay introduced by the second delay circuit 46, and $\tau_{ADJ}$ represents a predefined temporal offset that compensates for any estimation error. In an embodiment, the control circuit 50 may provide the determined relative group delay τ to the transceiver circuit 26 in FIG. 2 such that the transceiver circuit 26 can delay or advance the RF signal 28 based on the determined relative group delay τ to thereby ensure that the modulated current $I_{PA}$ is aligned with the modulated voltage $V_{CC}$ at the power amplifier circuit 12.

Figure 6:
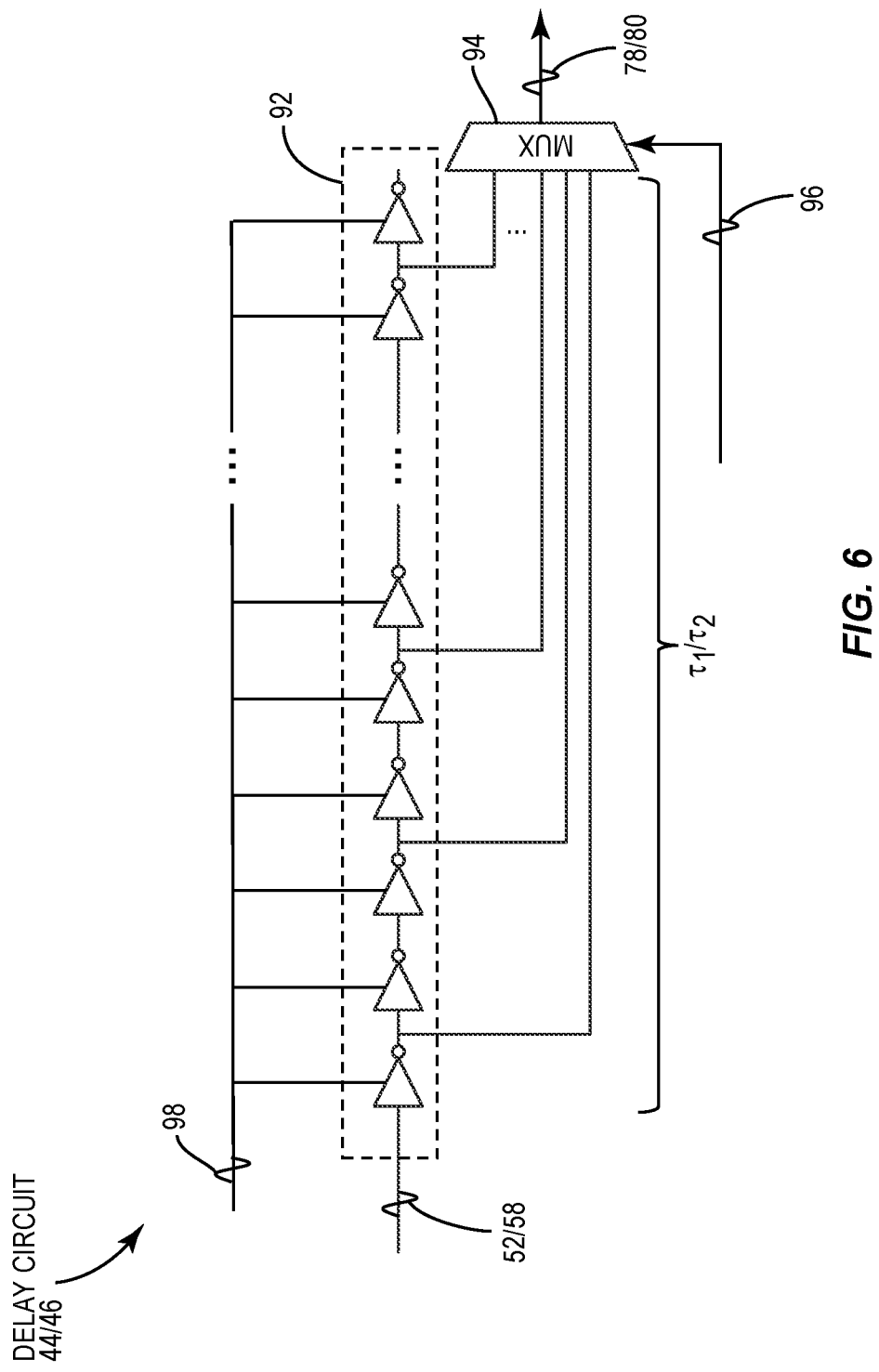
FIG. 6 is a schematic diagram illustrating a delay circuit in the group delay determination circuit of FIG. 3.

FIG. 6 is a schematic diagram illustrating an exemplary implementation of the first delay circuit 44 and the second delay circuit 46 in the group delay determination circuit 22 of FIG. 3. Common elements between FIGS. 3 and 6 are shown therein with common element numbers and will not be re-described herein.

In an embodiment, each of the first delay circuit 44 and the second delay circuit 46 can include a respective delay line 92 and a respective multiplexer 94. The multiplexer 94 may be controlled by the control circuit 50 in FIG. 5 via a control signal 96 to selectively delay the rectangular current signal 52 by the first adjustable delay ti or the rectangular voltage signal 58 by the second adjustable delay 12. In an embodiment, the delay line 92 may be calibrated by a calibration signal 98.

Figure 7:
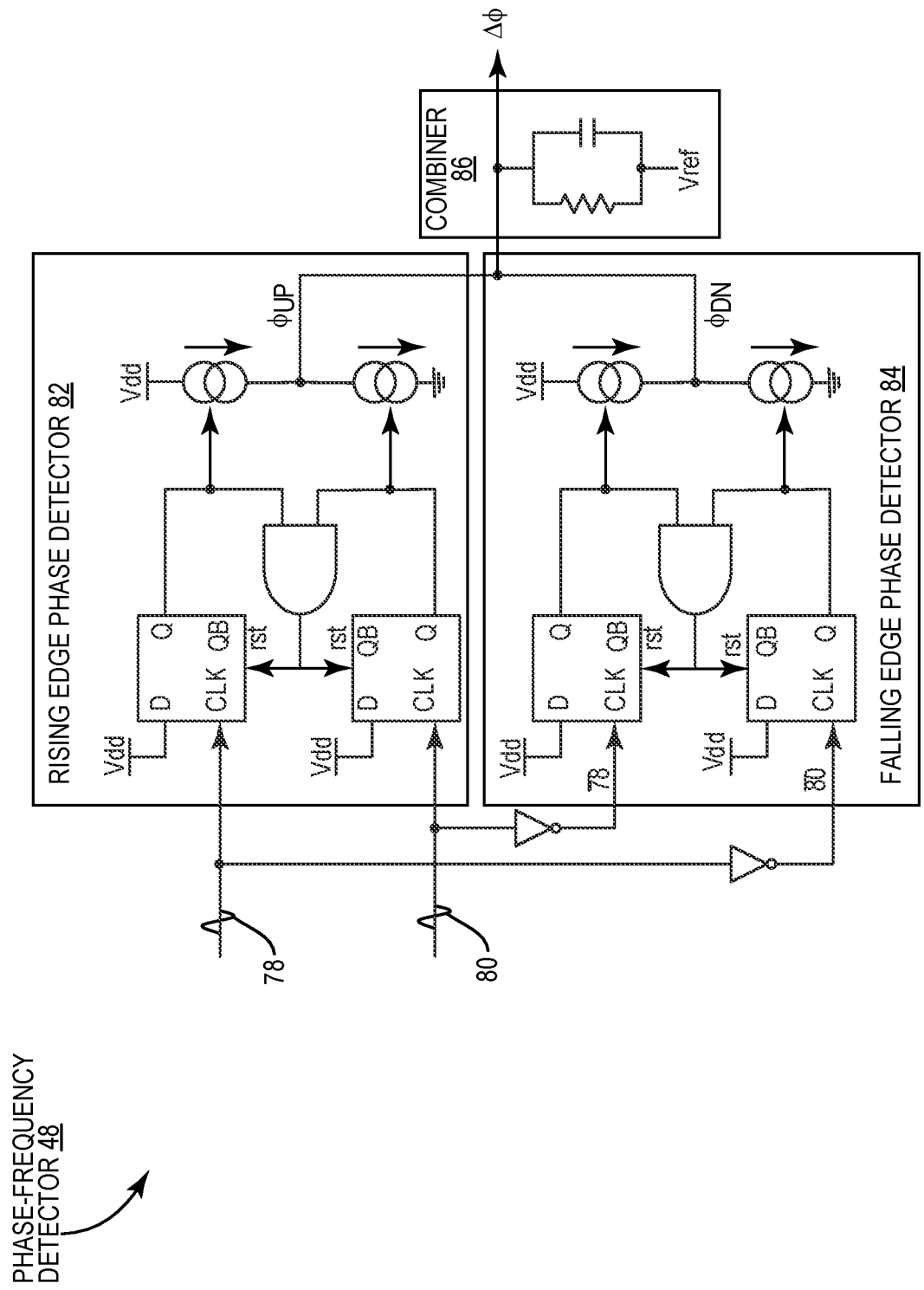
FIG. 7 is a schematic diagram illustrating a phase-frequency detector in the group delay determination circuit of FIG. 3.

FIG. 7 is a schematic diagram illustrating an exemplary implementation of the phase-frequency detector 48 in the group delay determination circuit 22 of FIG. 3. Common elements between FIGS. 3 and 7 are shown therein with common element numbers and will not be re-described herein.

With reference back to FIG. 2, the current modulation circuit 36 includes a multi-level charge pump (MCP) 100 and a power inductor 102. The MCP 100, which can be a buck-boost direct-current (DC) to DC (DC-DC) converter, is configured to generate a low-frequency voltage $V_{DC}$ (e.g., a DC voltage) as a function of a battery voltage $V_{BAT}$. Specifically, the MCP 100 may operate in a buck mode to generate the low-frequency voltage $V_{DC}$ at $0 \times V_{BAT}$ (0 V) or $1 \times V_{BAT}$, or in a boost mode to generate the low-frequency voltage $V_{DC}$ at $2 \times V_{BAT}$. In addition, the MCP 100 may toggle between $0 \times V_{BAT}$ (0 V), $1 \times V_{BAT}$, and/or $2 \times V_{BAT}$ based on a duty cycle 104 to thereby generate the low-frequency voltage $V_{DC}$ at a desired voltage level. In a non-limiting example, the current modulation circuit 36 can include a controller 106 (e.g., a microcontroller or a microprocessor) that determines the duty cycle 104 based on the modulated target voltage $V_{TGT}$.

The power inductor 102 is configured to induce a low-frequency current $I_{DC}$ based on the low-frequency voltage $V_{DC}$. In an embodiment and as further described in Application244, the low-frequency current $I_{DC}$ is configured to modulate the offset voltage $V_{OFF}$ across the offset capacitor $C_{OFF}$.

Figure 8:
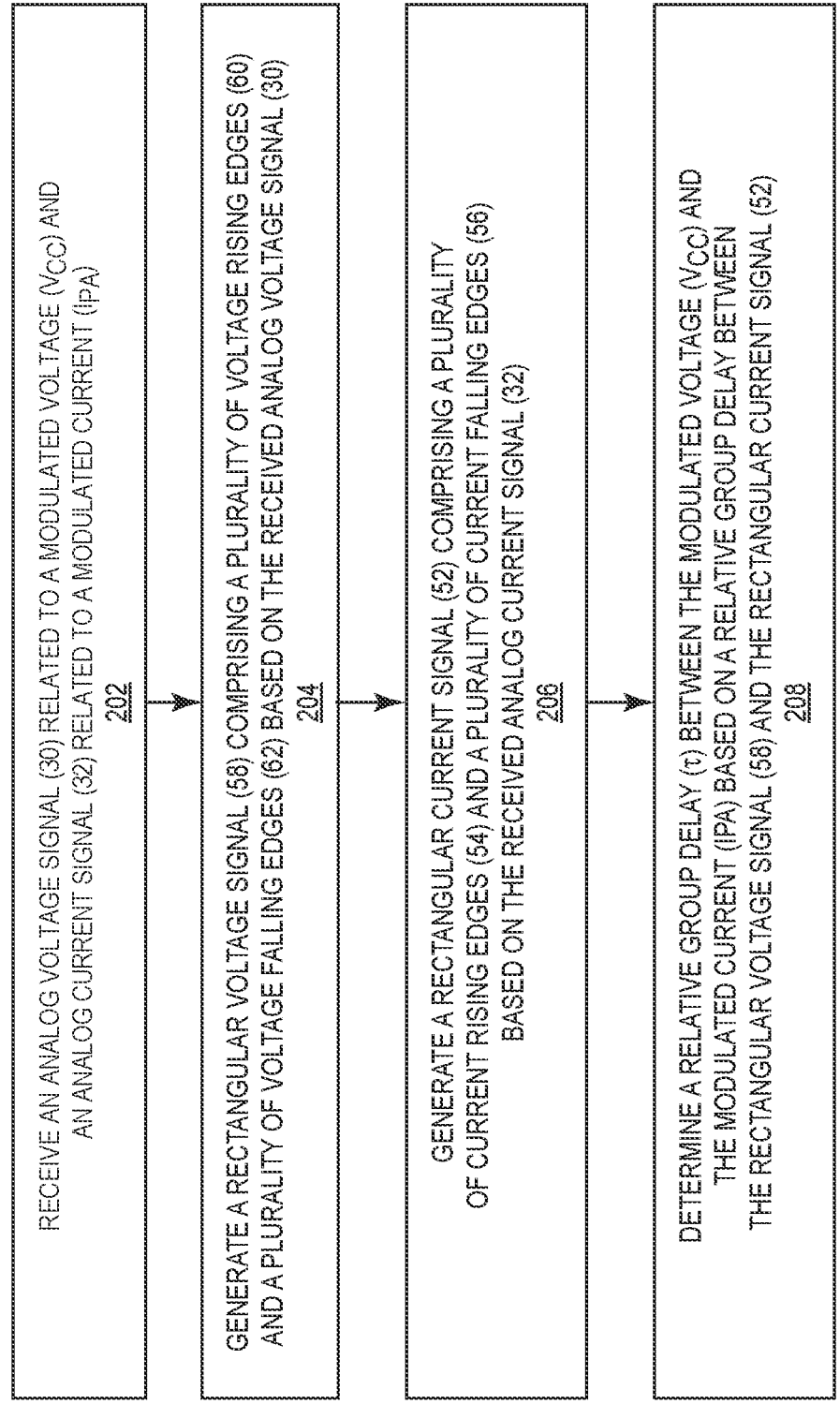
FIG. 8 is a flowchart of an exemplary process that can be employed by the communication circuit of FIG. 2 for determining the relative group delay between the modulated voltage and the modulated current.

The communication circuit 20 of FIG. 2 can be configured to support group delay determination as described above based on a process. In this regard, FIG. 8 is a flowchart of an exemplary process 200 determining the group delay τ in the communication circuit 20 of FIG. 2.

Herein, the group delay determination circuit 22 receives the analog voltage signal 30 that is related to the modulated voltage $V_{CC}$ and the analog current signal 32 that is related to the modulated current $I_{PA}$ (step 202). Next, the group delay determination circuit 22 generates the rectangular voltage signal 58 having the voltage rising edges 60 and the voltage falling edges 62 based on the received analog voltage signal 30 (step 204). The group delay determination circuit 22 also generates the rectangular current signal 52 having the current rising edges 54 and the current falling edges 56 based on the received analog current signal 32 (step 206). Accordingly, the group delay determination circuit 22 determines the relative group delay τ between the modulated voltage $V_{CC}$ and the modulated current $I_{PA}$ based on the relative group delay τ between the rectangular voltage signal 58 and the rectangular current signal 52 (step 208).

Those skilled in the art will recognize improvements and modifications to the embodiments of the present disclosure. All such improvements and modifications are considered within the scope of the concepts disclosed herein and the claims that follow.

What is claimed is:

1. A group delay determination circuit comprising:
a signal conversion circuit configured to:
receive an analog voltage signal related to a modulated voltage and an analog current signal related to a modulated current;
generate a rectangular voltage signal comprising a plurality of voltage rising edges and a plurality of voltage falling edges based on the received analog voltage signal; and
generate a rectangular current signal comprising a plurality of current rising edges and a plurality of current falling edges based on the received analog current signal and the received analog voltage signal; and
a control circuit configured to determine a relative group delay between the modulated voltage and the modulated current based on a relative delay between the rectangular voltage signal and the rectangular current signal.

2. The group delay determination circuit of claim 1, wherein the control circuit is further configured to:
dynamically delay at least one of the rectangular voltage signal and the rectangular current signal to thereby cause the rectangular voltage signal to be in-phase with the rectangular current signal; and
determine the relative group delay between the rectangular voltage signal and the rectangular current signal when the rectangular voltage signal is in-phase with the rectangular current signal.

3. The group delay determination circuit of claim 2, further comprising:
a first delay circuit configured to delay the rectangular current signal by a first adjustable delay to generate a delayed rectangular current signal comprising the plurality of current rising edges and the plurality of current falling edges;
a second delay circuit configured to delay the rectangular voltage signal by a second adjustable delay to generate a delayed rectangular voltage signal comprising the plurality of voltage rising edges and the plurality of voltage falling edges; and
a phase-frequency detector configured to determine a phase differential between the delayed rectangular current signal and the delayed rectangular voltage signal;
wherein the control circuit is further configured to:
control at least one of the first delay circuit and the second delay circuit until the phase differential is equal to zero; and
determine the relative group delay between the rectangular voltage signal and the rectangular current signal when the phase differential is equal to zero.

4. The group delay determination circuit of claim 3, wherein the relative group delay comprises a difference between the first adjustable delay and the second adjustable delay and a predefined temporal offset.

5. The group delay determination circuit of claim 3, wherein the phase-frequency detector comprises:
a rising edge phase detector configured to detect a rising edge phase offset between each of the plurality of voltage rising edges and a respective one of the plurality of current rising edges;
a falling edge phase detector configured to detect a falling edge phase offset between each of the plurality of voltage falling edges and a respective one of the plurality of current falling edges; and
a combiner configured to subtract the falling edge phase offset from the rising edge phase offset to generate the phase differential.

6. The group delay determination circuit of claim 1, wherein the signal conversion circuit comprises:
a current estimator configured to estimate a differential between the modulated current and the analog current signal based on the analog voltage signal;
a current combiner configured to combine the analog current signal with the estimated differential to generate an estimation of the modulated current;
a first comparator configured to generate the rectangular current signal based on the estimation of the modulated current and a predefined current threshold; and
a second comparator configured to generate the rectangular voltage signal based on the analog voltage signal and a predefined voltage threshold.

7. The group delay determination circuit of claim 1, wherein the signal conversion circuit comprises:
a current estimator configured to estimate a differential between the modulated current and the analog current signal based on the analog voltage signal;
a second current estimator configured to estimate an adjustment term to the analog current signal based on a second analog voltage signal;
a current combiner configured to combine the analog current signal with the estimated differential and the estimated adjustment term to generate an estimation of the modulated current;
a first comparator configured to generate the rectangular current signal based on the estimation of the modulated current and a predefined current threshold; and
a second comparator configured to generate the rectangular voltage signal based on the analog voltage signal and a predefined voltage threshold.

8. A communication circuit comprising:
a power amplifier circuit configured to amplify a radio frequency (RF) signal associated with a time-variant input power based on a modulated voltage and induce a modulated current that tracks the time-variant input power of the RF signal; and
a power amplifier integrated circuit (PMIC) comprising:
a voltage modulation circuit configured to generate the modulated voltage based on a modulated target voltage; and
a group delay determination circuit comprising:
a signal conversion circuit configured to:
receive an analog voltage signal related to the modulated voltage and an analog current signal related to the modulated current;
generate a rectangular voltage signal comprising a plurality of voltage rising edges and a plurality of voltage falling edges based on the received analog voltage signal; and
generate a rectangular current signal comprising a plurality of current rising edges and a plurality of current falling edges based on the received analog current signal and the received analog voltage signal; and
a control circuit configured to determine a relative group delay between the modulated voltage and the modulated current based on a relative delay between the rectangular voltage signal and the rectangular current signal.

9. The communication circuit of claim 8, further comprising a transceiver circuit configured to:
generate the RF signal associated with the time-variant input power;
generate the modulated target voltage that tracks the time-variant input power of the RF signal;
receive the determined relative group delay between the modulated voltage and the modulated current; and
delay the RF signal by the determined relative group delay to thereby time align the modulated voltage and the modulated current at the power amplifier circuit.

10. The communication circuit of claim 8, wherein the voltage modulation circuit comprises:
a voltage amplifier configured to:
generate a modulated initial voltage based on the modulated target voltage;
cause a high-frequency current between the voltage amplifier and the power amplifier circuit; and
generate a sensed current proportionally related to the high-frequency current; and
an offset capacitor configured to raise the modulated initial voltage by an offset voltage modulated by a low-frequency current to thereby generate the modulated voltage.

11. The communication circuit of claim 10, wherein the PMIC further comprises a current modulation circuit configured to generate the low-frequency current based on the modulated target voltage and as a function of a battery voltage.

12. The communication circuit of claim 10, wherein the group delay determination circuit is further configured to:
receive the modulated target voltage as the analog voltage signal; and
receive the sensed current as the analog current signal.

13. The communication circuit of claim 11, wherein the signal conversion circuit comprises:
a current estimator configured to estimate a differential between the modulated current and the analog current signal based on the analog voltage signal;
a current combiner configured to combine the analog current signal with the estimated differential to generate an estimation of the modulated current;
a first comparator configured to generate the rectangular current signal based on the estimation of the modulated current and a predefined current threshold; and
a second comparator configured to generate the rectangular voltage signal based on the analog voltage signal and a predefined voltage threshold.

14. The communication circuit of claim 10, wherein the group delay determination circuit is further configured to:
receive the modulated target voltage as the analog voltage signal;
receive the modulated initial voltage as a second analog voltage signal; and
receive the sensed current as the analog current signal.

15. The communication circuit of claim 14, wherein the signal conversion circuit comprises:
- a current estimator configured to estimate a differential between the modulated current and the analog current signal based on the analog voltage signal;
- a second current estimator configured to estimate an adjustment term to the analog current signal based on the second analog voltage signal;
- a current combiner configured to combine the analog current signal with the estimated differential and the estimated adjustment term to generate an estimation of the modulated current;
- a first comparator configured to generate the rectangular current signal based on the estimation of the modulated current and a predefined current threshold; and
- a second comparator configured to generate the rectangular voltage signal based on the analog voltage signal and a predefined voltage threshold.

16. A method for determining a group delay in a communication circuit comprising:
- receiving an analog voltage signal related to a modulated voltage and an analog current signal related to a modulated current;
- generating a rectangular voltage signal comprising a plurality of voltage rising edges and a plurality of voltage falling edges based on the received analog voltage signal;
- generating a rectangular current signal comprising a plurality of current rising edges and a plurality of current falling edges based on the received analog current signal and the received analog voltage signal; and
- determining a relative group delay between the modulated voltage and the modulated current based on a relative delay between the rectangular voltage signal and the rectangular current signal.

17. The method of claim 16, further comprising:
- dynamically delaying at least one of the rectangular voltage signal and the rectangular current signal to thereby cause the rectangular voltage signal to be in-phase with the rectangular current signal; and
- determining the relative group delay between the rectangular voltage signal and the rectangular current signal when the rectangular voltage signal is in-phase with the rectangular current signal.

18. The method of claim 17, further comprising:
- delaying the rectangular current signal by a first adjustable delay to generate a delayed rectangular current signal comprising the plurality of current rising edges and the plurality of current falling edges;
- delaying the rectangular voltage signal by a second adjustable delay to generate a delayed rectangular voltage signal comprising the plurality of voltage rising edges and the plurality of voltage falling edges;
- determining a phase differential between the delayed rectangular current signal and the delayed rectangular voltage signal; and
- determining the relative group delay between the rectangular voltage signal and the rectangular current signal when the phase differential is equal to zero, wherein the relative group delay comprises a difference between the first adjustable delay and the second adjustable delay and a predefined temporal offset.

19. The method of claim 16, further comprising:
- estimating a differential between the modulated current and the analog current signal based on the analog voltage signal;
- combining the analog current signal with the estimated differential to generate an estimation of the modulated current;
- generating the rectangular current signal based on the estimation of the modulated current and a predefined current threshold; and
- generating the rectangular voltage signal based on the analog voltage signal and a predefined voltage threshold.

20. The method of claim 16, further comprising:
- estimating a differential between the modulated current and the analog current signal based on the analog voltage signal;
- estimating an adjustment term to the analog current signal based on a second analog voltage signal;
- combining the analog current signal with the estimated differential and the estimated adjustment term to generate an estimation of the modulated current;
- generating the rectangular current signal based on the estimation of the modulated current and a predefined current threshold; and
- generating the rectangular voltage signal based on the analog voltage signal and a predefined voltage threshold.

* * * * *

UNITED STATES PATENT AND TRADEMARK OFFICE
CERTIFICATE OF CORRECTION

Page 1 of 1

PATENT NO. : 12,388,429 B2
APPLICATION NO. : 17/960389
DATED : August 12, 2025
INVENTOR(S) : Marcus Granger-Jones and Nadim Khlat It is certified that error appears in the above-identified patent and that said Letters Patent is hereby corrected as shown below:

In the Specification

In Column 5, at Line 51, change "Pour" to -- $P_{OUT}$ --

In Column 6, at Line 54, change "Pour" to -- $P_{OUT}$ --

In Column 9, at Line 3, change "LAMP" to -- $I_{AMP}$ --

In Column 9, at Line 60, change "delay 12" to -- delay $\tau 2$ --

In Column 11, at Line 21, change "ti" to -- $\tau 1$ --

In Column 11, at Line 22, change "delay 12" to -- delay $\tau 2$ --

Signed and Sealed this
Sixteenth Day of September, 2025

Coke Morgan Stewart
*Acting Director of the United States Patent and Trademark Office*